United States Patent
Higeta

(10) Patent No.: US 8,732,532 B2
(45) Date of Patent: May 20, 2014

(54) MEMORY CONTROLLER AND INFORMATION PROCESSING SYSTEM FOR FAILURE INSPECTION

(75) Inventor: Masanori Higeta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 157 days.

(21) Appl. No.: 13/226,672

(22) Filed: Sep. 7, 2011

(65) Prior Publication Data

US 2012/0131382 A1    May 24, 2012

(30) Foreign Application Priority Data

Nov. 24, 2010  (JP) ................................ 2010-261110

(51) Int. Cl.
*G06F 11/00* (2006.01)
(52) U.S. Cl.
USPC .......................................................... 714/42
(58) Field of Classification Search
CPC . G06F 11/07; G06F 11/1048; G06F 11/1641; G06F 11/1657; G06F 11/167
USPC ........ 714/6.1, 6.2, 6.21, 6.22, 6.23, 6.24, 6.3, 714/6.32, 42, 43, 52, 54, 56
See application file for complete search history.

(56) References Cited

U.S. PATENT DOCUMENTS

| | | | |
|---|---|---|---|
| 7,386,765 B2* | 6/2008 | Ellis et al. ........................ 714/42 |
| 7,644,347 B2* | 1/2010 | Alexander et al. ............ 714/799 |
| 2008/0301529 A1* | 12/2008 | Spanel et al. .................. 714/765 |
| 2008/0301530 A1* | 12/2008 | Spanel et al. .................. 714/765 |
| 2009/0164872 A1* | 6/2009 | Chessin et al. ................. 714/765 |
| 2011/0040924 A1* | 2/2011 | Selinger ........................ 711/103 |

FOREIGN PATENT DOCUMENTS

JP  2004-334707  11/2004
JP  2008-171287   7/2008

* cited by examiner

*Primary Examiner* — Scott Baderman
*Assistant Examiner* — Joseph Kudirka
(74) *Attorney, Agent, or Firm* — Staas & Halsey LLP

(57) ABSTRACT

An information processing system comprises a memory module having a plurality of unit memory regions, a memory controller, connected to the memory module via memory interface, configured to control access to the memory module, an error detector, which is in the memory controller, configured to perform an error detection on data read from the memory module, a failure inspection controller configured to switch a mode of the memory controller from a normal mode to a failure inspection mode, read data from an address, where data was written, to be inspected for each of the plurality of unit memory regions, cause the error detector to detect an error in the read data and perform a failure inspection and a determining unit configured to determine a memory failure or a transmission path failure on the basis of the state of the error detected from the unit memory regions.

18 Claims, 11 Drawing Sheets

FIG. 4A

| ADDRESS | DATA | ERROR TYPE |
|---|---|---|
| RANK #0 0X0010 | XXXX | UNCORRECTABLE ERROR |

| ADDRESS | DATA | INSPECTION RESULT |
|---|---|---|
| RANK #0 0X0018 | XXXX | UNCORRECTABLE ERROR |
| RANK #0 0X0120 | XXXX | NO ERROR |
| RANK #1 0X0010 | XXXX | UNCORRECTABLE ERROR |
| RANK #1 0X0020 | XXXX | NO ERROR |
| RANK #2 0X0014 | XXXX | CORRECTABLE ERROR |
| RANK #2 0X0100 | XXXX | UNCORRECTABLE ERROR |
| RANK #3 0X1010 | XXXX | NO ERROR |
| RANK #3 0X2040 | XXXX | CORRECTABLE ERROR |
| ⋮ | ⋮ | ⋮ |
| RANK #N 0X0114 | XXXX | UNCORRECTABLE ERROR |
| RANK #N 0X1012 | XXXX | UNCORRECTABLE ERROR |

| ADDRESS | DATA | ERROR TYPE |
|---|---|---|
| RANK #0 0X0010 | XXXX | UNCORRECTABLE ERROR |

| ADDRESS | DATA | INSPECTION RESULT |
|---|---|---|
| RANK #0 0X0018 | XXXX | UNCORRECTABLE ERROR |
| RANK #0 0X0120 | XXXX | UNCORRECTABLE ERROR |
| RANK #1 0X0010 | XXXX | NO ERROR |
| RANK #1 0X0020 | XXXX | NO ERROR |
| RANK #2 0X0014 | XXXX | NO ERROR |
| RANK #2 0X0100 | XXXX | NO ERROR |
| RANK #3 0X1010 | XXXX | NO ERROR |
| RANK #3 0X2040 | XXXX | NO ERROR |
| ⋮ | ⋮ | ⋮ |
| RANK #N 0X0114 | XXXX | NO ERROR |
| RANK #N 0X1012 | XXXX | NO ERROR |

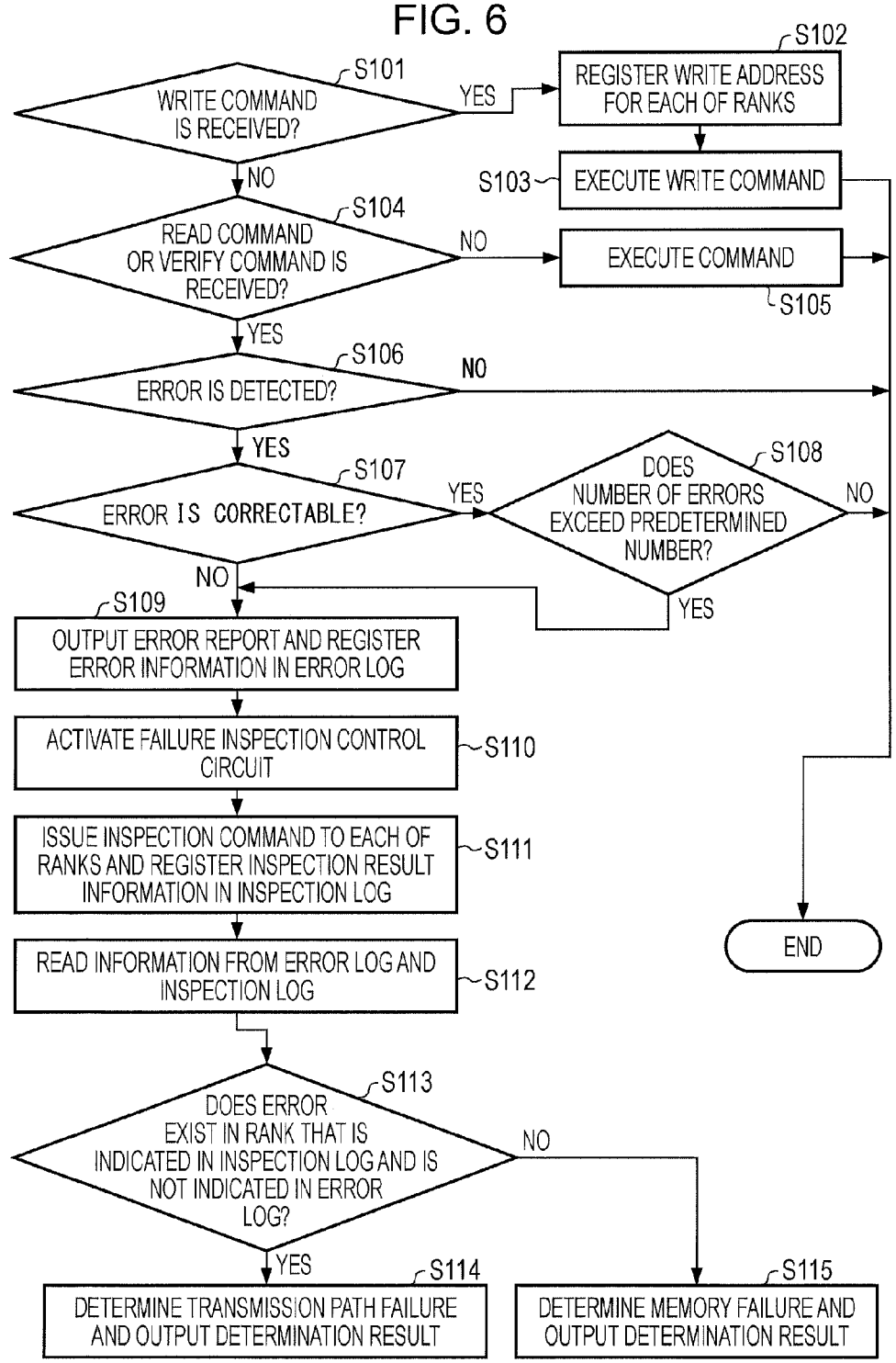

MEMORY CONTROLLER AND INFORMATION PROCESSING SYSTEM FOR FAILURE INSPECTION

CROSS-REFERENCE TO RELATED APPLICATION

This application is based upon and claims the benefit of priority of the prior Japanese Patent Application No. 2010-261110, filed on Nov. 24, 2010, the entire contents of which are incorporated herein by reference.

FIELD

The embodiments discussed herein are related to a memory controller and information processing system

BACKGROUND

In recent years, with an increase in the size of an information processing system, the capacity of a memory to be installed in the system has increased, and there has been a demand for high reliability of a memory. In order to ensure high reliability of a large-capacity memory, there is a demand to quickly detect the location of a failure that occurs in the memory.

For the detection, there is a known technique for detecting a memory failure that is a defective connection of a data bus, a defective connection of an address bus or the like, which occurs during implementation of a board. Japanese Laid-open Patent Publication Nos. 2004-334707 and 2008-171287 are examples of related art.

SUMMARY

According to an aspect of the embodiment, an information processing system comprises a memory module having a plurality of unit memory regions, a memory controller, connected to the memory module via a memory interface, configured to control access to the memory module, an error detector, which is in the memory controller, configured to perform an error detection on data read from the memory module, a failure inspection controller configured to switch a mode of the memory controller from a normal mode to a failure inspection mode, read data from an address, where data was written, to be inspected for each of the plurality of unit memory regions, cause the error detector to detect an error in the read data and perform a failure inspection and a determining unit configured to determine a memory failure or a transmission path failure on the basis of the state of the error detected from the unit memory regions.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4A is a diagram illustrating an example of a table of an error log when a transmission path failure occurs.

FIG. 4B is a diagram illustrating an example of a table of an inspection log when the transmission path failure occurs.

FIG. 5A is a diagram illustrating an example of a table of an error log when a memory failure occurs.

FIG. 5B is a diagram illustrating an example of a table of an inspection log when the memory failure occurs.

FIG. 6 is a flowchart of a failure determination process to be performed by the information processing system according to the first embodiment.

DESCRIPTION OF EMBODIMENTS

As a large-capacity memory module, a dual inline memory module (DIMM) is known. A plurality of storage elements such as synchronous dynamic random access memories (SDRAMs) are included in the DIMM. The possibility that a failure may occur in the storage elements, a transmission path or the like in the DIMM has increased.

Thus, there is a demand to more quickly and more accurately determine a transmission path failure (that is caused by a transmission path of a memory interface, a transmission path of a memory controller or the like and occurs outside the memory module) or a memory failure that is caused by a failure that occurs in the memory module. In addition, when a failure occurs in the memory module during an operation of an information processing system, it is necessary to quickly take measures on the basis of the location of the failure and avoid stopping the operation of the information processing system as much as possible.

Figure 1:
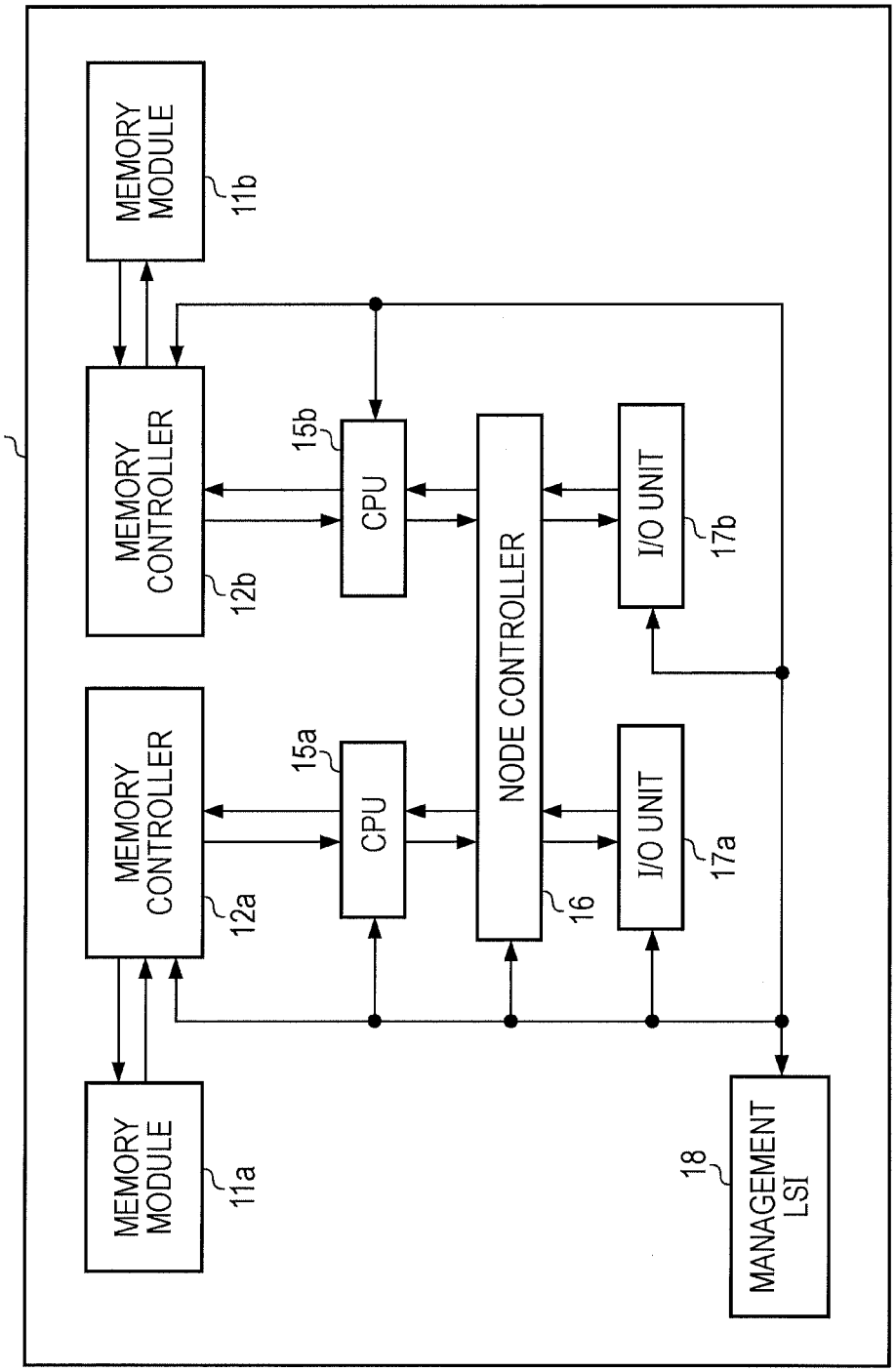
FIG. 1 is a diagram illustrating an outline configuration of an information processing system.

Embodiments are described below in detail with reference to the accompanying drawings. FIG. 1 is a diagram illustrating an outline configuration of an information processing system. As an example of the information processing system, a system board 1 is used and described below. The system board 1 includes memory modules 11a, 11b, memory controllers 12a, 12b, central processing units (CPUs) 15a, 15b, a node controller 16, input/output (I/O) units 17a, 17b and a management LSI 18.

The memory controller 12a is connected to the memory module 11a and the CPU 15a. The memory controller 12a receives a read command, a write command and the like from the CPU 15a and controls the memory module 11a.

The memory controller 12b is connected to the memory module 11b and the CPU 15b. The memory controller 12b receives a read command, a write command and the like from the CPU 15b and controls the memory module 11b.

The node controller 16 is connected to the CPUs 15a and 15b (included in the system board 1) and the I/O units 17a and 17b (included in the system board 1) and performs communication control on another system board and an external device. In addition, the management LSI 18 is connected to each of the circuits included in the system board 1 and monitors operational states of the circuits. In addition, the management LSI 18 can be provided with a control function of maintaining the circuits according to specifications set by a user.

Figure 2:
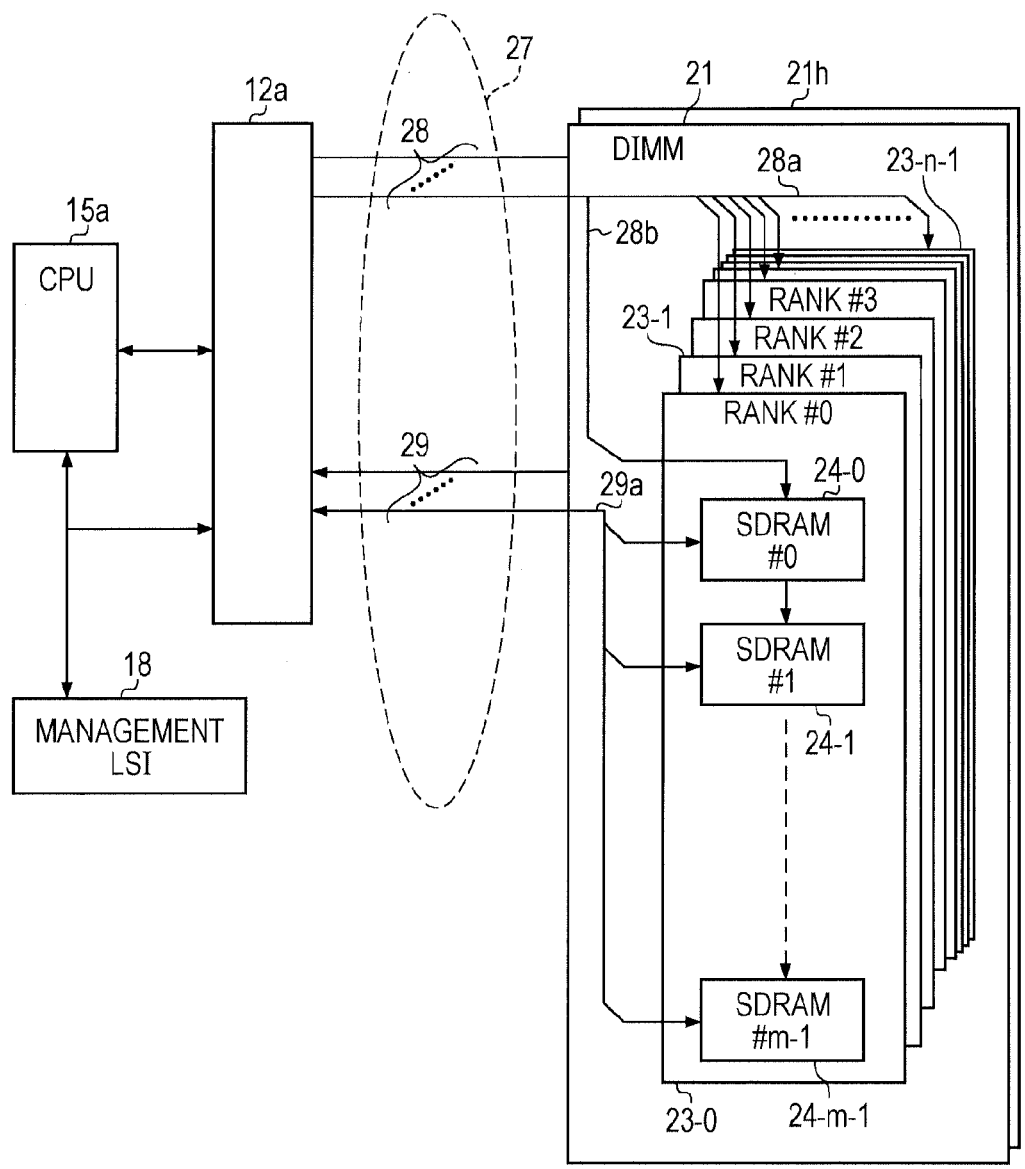
FIG. 2 is a diagram illustrating a configuration of a memory module.

FIG. 2 is a diagram illustrating a configuration of the memory module. An example of the memory module 11a is a DIMM. In a first embodiment, as the memory module 11a, a large-capacity memory module that has a DIMM 21 is used and described. The memory module 11b has the same configuration as the memory 11a, and a description thereof is omitted.

A DIMM 21h is a preliminary DIMM that is used as a spare DIMM when the DIMM 21 fails. The DIMM 21 has a number n of ranks 23-0 to 23-n-1 (n is an integer).

In addition, a plurality of storage elements are arranged side by side in each of the ranks 23-0 to 23-n-1. For example, a number m of SDRAMs 24-0 to 24-m-1 (m is an integer) are arranged side by side in the rank 23-0. The DIMM 21h has a plurality of ranks in the same manner as the DIMM 21.

In the present embodiment, since the memory modules are each managed on a rank basis, the ranks are described as unit memory regions. For example, when another type of memory modules in which addresses are managed on an SDRAM basis are used, SDRAMs can be treated as unit memory regions.

When the memory controller 12a receives a command to read data from the DIMM 21, a command to write data in the DIMM 21, or the like, the memory controller 12a transmits the received command and an address signal to the DIMM 21 through a command/address bus 28 of a memory interface 27.

Then, chip select (CS) signals that specify ranks 23-0 to 23-n-1 are transmitted to the ranks 23-0 to 23-n-1 through a signal bus 28a in the DIMM 21. In addition, addresses within the rank, which include memory addresses (MAs) and bank addresses (BAs), are transmitted to the SDRAMs 24-0 to 24-m-1 through a signal bus 28b, while the memory addresses and the bank addresses specify locations to be accessed in the SDRAMs.

Write data that is transmitted through a data bus 29 is provided to the SDRAMs 24-0 to 24-m-1 through a data bus 29a included in the DIMM 21. In addition, data that is read from the SDRAMs 24-0 to 24-m-1 is transmitted to the memory controller 12a through the data bus 29a included in the DIMM 21 and the data bus 29 of the memory interface 27.

Figure 3:
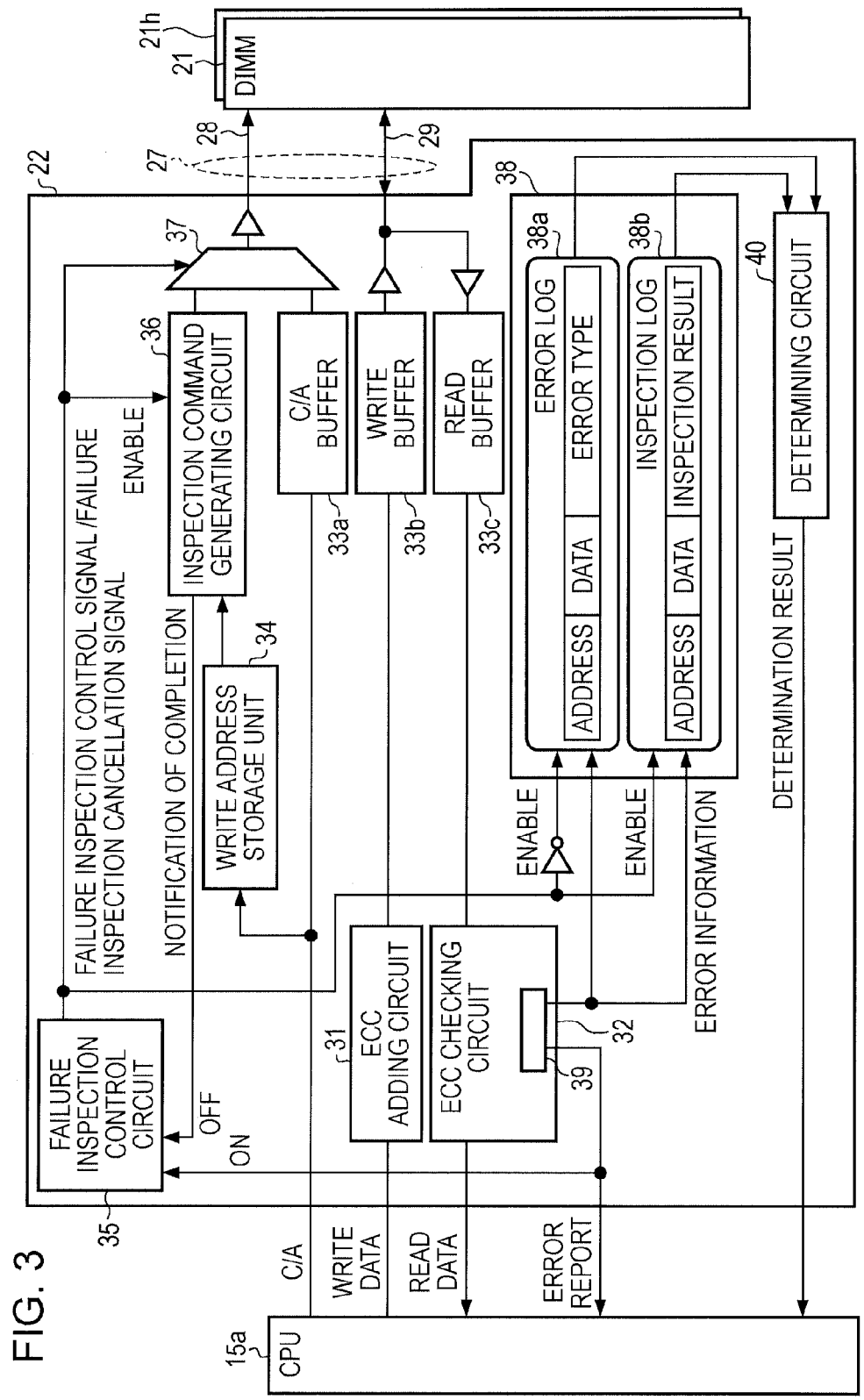
FIG. 3 is a diagram illustrating an internal configuration of a memory controller that is included in the information processing system according to a first embodiment.

FIG. 3 is a diagram illustrating an internal configuration of the memory controller included in the information processing system according to the first embodiment. FIG. 3 illustrates a memory controller 22 that is an example of the memory controller 12a illustrated in FIG. 2, and an illustration of the management LSI 18 is omitted in FIG. 3.

The memory controller 22 includes a failure inspection control circuit 35 and an inspection command generating circuit 36, which are an example of a failure inspection controller. In addition, the memory controller 22 includes a determining circuit 40 that is an example of a determining unit.

When the memory controller 22 receives a write command and an address signal from the CPU 15a, the memory controller 22 temporarily stores the write command and the address signal in a command/address buffer (C/A buffer) 33a. Then, the write command and the address are transmitted to the DIMM 21 through the command/address bus 28.

A write address storage unit 34 receives the write command and the address signal. Every time the write address storage unit 34 receives a write command, the write address storage unit 34 stores a write address for each of the ranks of the DIMM 21. In addition, the write address storage unit 34 is updated so that one or more write addresses that include the latest write address within each of the ranks are rewritten and registered.

Since an address where data was written in the past can be registered in the write address storage unit 34, the write address storage unit 34 can prevent an inspection command to read data from an unused address (where data is not written) from being issued.

The type of data written at the unused address is not clear. In addition, even when data is already erased, it is not clear how the user uses the system during an operation of the system. Thus, in order to prevent an error from being erroneously detected, the inspection command to read data from the unused address is not issued.

When it is clear that data for deletion, such as data with only zeros, is written, there is a low possibility that an error is erroneously detected. Thus, an address where the data for deletion is written can be registered in the write address storage unit 34 in accordance with an erase command to write the data for deletion. Thus, the inspection command to read data from this address may be issued.

In addition, it is sufficient if a minimum number of records that are necessary to easily perform a failure inspection at a high speed are registered in the write address storage unit 34. It is not necessary that write addresses where data is to be written in accordance with all write commands be stored in the write address storage unit 34. The details are described later.

In addition, an error check code (ECC) is added to data (write data that has been transmitted from the CPU 15a and is to be written) by an error check code (ECC) adding circuit 31. The write data with the error check code added thereto is temporarily stored in a write buffer 33b. After that, the write data with the error check code added thereto is transmitted to a specific write address of the DIMM 21 through the data bus 29 while being synchronized with a predetermined clock.

In addition, when the memory controller 22 receives a read command and an address signal from the CPU 15a, the memory controller 22 temporarily stores the read command and the address signal in the command/address buffer (C/A buffer) 33a. The read command and the address signal are transmitted to the DIMM 21 through the command/address bus 28 while being synchronized with a predetermined clock.

Data that is read from the DIMM is transmitted to a read buffer 33c through the data bus 29 while being synchronized with a predetermined clock. Then, the read data is temporarily stored in the read buffer 33c. An ECC checking circuit 32 detects an error in the read data and corrects the error. Then, the ECC checking circuit 32 transmits the read data to the CPU 15a.

In this case, when the ECC checking circuit 32 cannot correct the error of the read data, an error information output unit 39 that is included in the ECC checking circuit 32 outputs, to the CPU 15a and the failure inspection control circuit 35, an error report that indicates that the uncorrectable error occurs.

The error information output unit 39 has a counter. When a correctable error is detected in the read data, the error information output unit 39 uses the counter to count the number of correctable errors. Then, when the number of errors exceeds a predetermined number, the error information output unit 39 outputs an error report to the CPU 15a and the failure inspection control circuit 35.

The system may be configured so that the management LSI 18 performs the process on the error and the errors instead of the CPU 15a. In this case, the error information output unit 39 outputs the error reports to the management LSI 18, although this configuration is not illustrated in FIG. 3.

The error information output unit 39 simultaneously outputs an interested error report and outputs, to an internal memory 38, error information that includes an address, the read data, an error type and the like. Then, the error information is registered in a table of an error log 38a that is an example of a first storage unit.

When the failure inspection control circuit 35 receives any of the error reports, the failure inspection control circuit 35 turns on a control function of the failure inspection control circuit 35 and is activated. The activated failure inspection control circuit 35 outputs a failure inspection control signal to each of the circuits included in the memory controller 22 so as to change a mode of each of the circuits from a normal mode to a failure inspection mode.

When the inspection command generating circuit 36 receives the failure inspection control signal, the inspection command generating circuit 36 is activated. Then, the inspection command generating circuit 36 reads a write address from the write address storage unit 34 for each of the ranks of the DIMM 21 and extracts write addresses to be inspected. The inspection command generating circuit 36 generates an inspection command to read data from the write addresses to be inspected. Then, the inspection command generating circuit 36 outputs the inspection command to the DIMM 21.

At the stage of a manufacturing process, all the ranks of the DIMM 21 can be set to ranks to be inspected. However, during an operation of the system, when a time for an inspection is long, a system error may occur with high probability. Thus, it is preferable that the ranks to be inspected be selected on the basis of the status of use of the DIMM 21 during an operation of the system.

When a selector 37 is in the normal mode, the selector 37 outputs a command received from the CPU 15a. When the selector 37 receives the failure inspection control signal, the selector 37 switches signal lines and outputs the inspection command received from the inspection command generating circuit 36. When the failure inspection is completed and the selector 37 receives a failure inspection cancellation signal, the selector 37 switches the signal lines and outputs a command received from the CPU 15a. Thus, during the failure inspection, the selector 37 prevents a normal write command received from the CPU 15a, a normal read command received from the CPU 15a and the like from being issued.

The ECC checking circuit 32 detects an error in the data read for the failure inspection and corrects the error in the same manner as the normal mode. The error information output unit 39 outputs, to the internal memory 38, inspection result information that includes an address, the read data, an error type and the like, regardless of whether or not the error exists. Then, the inspection result information is stored in an inspection log 38b that is included in the internal memory 38 and is an example of a second storage unit.

The determining circuit 40 determines the location of a failure on the basis of at least one of the information stored in the error log 38a and the information stored in the inspection log 38b, or determines whether the failure is a transmission path failure or a memory failure on the basis of at least one of the information stored in the error log 38a and the information stored in the inspection log 38b. Then, the determining circuit 40 notifies the CPU 15a (or the management LSI 18) of the result of the determination. When the CPU 15a (or the management LSI 18) receives the result of the determination, the CPU 15a (or the management LSI 18) controls a recovery process to be performed by the memory controller and notifies an external of information of the location of the failure.

When data is completely read from all ranks to be inspected, the inspection command generating circuit 36 outputs a notification of the completion to the failure inspection control circuit 35. The failure inspection control circuit 35 outputs a failure inspection cancellation signal to each of the circuits included in the memory controller 22 so as to change the mode of each of the circuits from the failure inspection mode to the normal mode. After that, the failure inspection control circuit 35 turns off the control function.

FIG. 4A is a diagram illustrating an example of the error log when a transmission path failure occurs, while FIG. 4B is a diagram illustrating an example of the inspection log when the transmission path failure occurs. FIG. 4A illustrates, as the example, a table 110 of the error log 38 that has, stored therein, the error information of the DIMM 21. In the example illustrated in FIG. 4A, an uncorrectable error occurs in a rank #0. The example illustrated in FIG. 4A is described below.

At least an address, read data and an error type are stored in the table 110 of the error log 38a. The address of the rank and an address within the rank are registered in an address field of the table 110. In an error type field of the table 110, "correctable error" or "uncorrectable error" is registered.

FIG. 4B illustrates, as the example, a table 120 of the inspection log 38b that has, stored therein, information (failure inspection result information) of the results of the failure inspection performed on the DIMM 21. In the example illustrated in FIG. 4B, two addresses are inspected for each of the ranks. The example illustrated in FIG. 4B is described below.

At least an address, read data and an inspection result are registered as the inspection result information in the table 120 of the inspection log 38b. The addresses of the ranks and addresses within the ranks are registered in an address field of the table 120. In each of rows of an inspection result field of the table 120, "no error", "correctable error" or "uncorrectable error" is registered.

The determining circuit 40 reads the error information from the table 110 of the error log 38a, reads the failure inspection result information from the table 120 of the inspection log 38b and compares the error information with the failure inspection result information. In the table 110 of the error log 38a, the error information of the rank #0 includes information that indicates "uncorrectable error".

In the table 120 of the inspection log 38b, the results of the inspection of multiple ranks include information that indicates "uncorrectable error". Thus, from the comparison of the tables 110 and 120, it is apparent that an error occurs in a rank in the failure inspection mode and the rank is different from the rank #0 in which the error occurs in the normal mode of the memory controller 22.

When a failure occurs in a wiring located on the board or occurs in a transmitting/receiving circuit of the memory controller, an error may occur in all the ranks (including the rank #0 in which the error occurs in the normal mode) with high probability. Thus, the determining circuit 40 identifies that the error occurs in different ranks from the rank #0, and whereby the determining circuit 40 can easily and quickly determine a transmission path failure that is caused by a transmission path of the DIMM 21.

In addition, when the determining circuit 40 references only the table 120 of the inspection log 38b, the determining circuit 40 can determine whether an error occurs in a part of the ranks or in multiple ranks. Specifically, the determining circuit 40 can determine whether or not the error occurs across all ranks to be inspected. Thus, the determining circuit 40 can estimate and determine the transmission path failure that is caused by the transmission path of the DIMM 21. When the determining circuit 40 makes the determination in this manner, the error log can be omitted. Thus, the determination can be made more easily at a higher speed. When the determination needs to be made with high accuracy, it is preferable that the determination be made by comparing the table 110 of the error log 38a with the table 120 of the inspection log 38b.

FIG. 5A is a diagram illustrating an example of the table of the error log when a memory failure occurs, while FIG. 5B is a diagram illustrating an example of the table of the inspection log when the memory failure occurs. FIG. 5A illustrates, as the example, a table 210 of the error log 38a that has, stored therein, error information of the DIMM 21. In the example illustrated in FIG. 5A, an uncorrectable error occurs in the rank #0. The example illustrated in FIG. 5A is described below.

At least an address, read data and an error type are registered as the error information in the table 210 of the error log 38a. The address of the rank and the address within the rank are registered in an address field of the table 210. In an error type field of the table 210, "correctable error" or "uncorrectable error" is registered.

FIG. 5B illustrates, as the example, a table 220 of the inspection log 38b that has, stored therein, information (inspection result information) of the results of the failure inspection performed on the DIMM 21. In the example illustrated in FIG. 5B, two addresses are inspected for each of the ranks. The example illustrated in FIG. 5B is described below.

At least an address, read data and an inspection result are registered as the inspection result information in the table 220 of the inspection log 38b. The addresses of the ranks and addresses within the ranks are registered in an address field of the table 220. In each of rows of an inspection result field of the table 220, "no error", "correctable error" or "uncorrectable error" is registered.

The determining circuit 40 reads the error information from the table 210 of the error log 38a, reads the inspection result information from the table 220 of the inspection log 38b, and compares the error information with the inspection result information. In the table 210 of the error log 38a, the error information of the rank #0 includes information that indicates "uncorrectable error". In the table 220 of the inspection log 38b, two inspection results of the rank #0 each include information that indicates "uncorrectable error". However, the inspection results of the ranks other than the rank #0 each include information that indicates "no error".

Specifically, the error information and the inspection result information indicate that the errors occur in the same rank and that an error does not exist in the ranks other than the rank in which the errors occur. A failure of an SDRAM, a disconnection of a signal line or the like can be considered as a cause of a failure in the DIMM. When a failure occurs in the DIMM, a range in which the failure occurs is limited to a range in the rank in many cases. Thus, an error does not exist in the other ranks, and the other ranks can normally operate.

Since the error information and the inspection result information indicate that the errors occur only in the specific rank #0, the determining circuit 40 can determine a memory failure that is caused by a failure that occurs in at least one of the memories of the rank #0 of the DIMM 21.

When the determining circuit 40 references only the table 220 of the inspection log 38b, the determining circuit 40 can identify that an error occurs only in the specific rank #0 or a part of the ranks and that a failure does not exist in the other ranks. The determining circuit 40 may perform the identification operation in the aforementioned manner and thereby determine the memory failure that is caused by the failure that occurs in at least one of the memories of the rank #0 of the DIMM 21.

Thus, the error log can be omitted, and the determination can be easily made at a high speed. When the determination needs to be made with high accuracy, it is preferable that the determination be made by comparing the table 210 of the error log 38a with the table 220 of the inspection log 38b.

FIG. 6 is a flowchart of a failure determination process to be performed by the information processing system according to the first embodiment. When the memory controller 22 receives a write command (Yes in step S101), a write address is registered in the write address storage unit 34 for each of the ranks of the DIMM 21 (in step S102).

The memory controller 22 outputs the write command and an address signal to the DIMM 21 through the command/address bus 28. The memory controller 22 causes the DIMM 21 to execute the write command (in step S103).

When the memory controller 22 receives a read command or a verify command (Yes in step S104), the memory controller 22 outputs the received command and an address signal to the DIMM 21 through the command/address bus 28. Then, the memory controller 22 causes the DIMM 21 to execute the read command or the verify command. In addition, when the memory controller 22 receives another command such as an erase command (No in step S104), the memory controller 22 causes the DIMM 21 to execute the other command in a similar manner to the aforementioned manner.

When the DIMM 21 executes the read command or the verify command, and a read error is detected by the ECC checking circuit 32 as a result of the execution (Yes in step S106), the error information output unit 39 determines whether or not the read error is correctable (in step S107). When the read error is uncorrectable (No in step S107), the error information output unit 39 outputs the interested error report to the CPU 15a (or the management LSI 18) and the failure inspection control circuit 35 and registers information (error information) of the error in the error log 38a (in step S109).

When the read error is correctable (Yes in step S107), the error information output unit 39 determines whether or not the number of errors exceeds a predetermined number (in step S108). When the number of the errors exceeds the predetermined number (Yes in step S108), the error information output unit 39 outputs the interested error report to the CPU 15a (or the management LSI 18) and the failure inspection control circuit 35 and registers information (error information) of the errors in the error log 38a (in step S109).

When the failure inspection control circuit 35 receives any of the error reports, the failure inspection control circuit 35 turns on the control function and is activated (in step S110). Then, the failure inspection control circuit 35 outputs the failure inspection control signal to each of the circuits included in the memory controller 22 so as to change the mode of each of the circuits from the normal mode to the failure inspection mode.

When the inspection command generating circuit 36 receives the failure inspection control signal, the mode of the inspection command generating circuit 36 is changed to the failure inspection mode. The inspection command generating circuit 36 reads a write address from the write address storage unit 34 for each of the ranks of the DIMM 21 and extracts write addresses to be inspected.

The inspection command generating circuit 36 generates an inspection command to read data from the write addresses to be inspected, and issues the inspection command to each of the ranks to be inspected. In addition, the inspection command generating circuit 36 may generate a command to read data a plurality of times on the basis of the status of an operation of the information processing system and acquire a plurality of inspection results in order to perform an inspection with high accuracy.

The ECC checking circuit 32 detects an error in the data read for the failure inspection and corrects the error in the same manner as the normal mode. After that, the error information output unit 39 outputs inspection result information that includes an address, the read data, an error type and the like regardless of whether or not the error exists. The error information output unit 39 registers the inspection result information in the table of the inspection log 38b (in step S111).

The determining circuit 40 reads the information registered in the table of the error log 38a and the information registered in the table of the inspection log 38b (in step S112). The determining circuit 40 determines whether or not an error exists in a rank that is indicated in the inspection result information registered in the table of the inspection log 38b and is not indicated in the error information registered in the table of the error log 38a (in step S113).

When the error exists in the rank that is indicated in the inspection result information registered in the table of the inspection log 38b and is not indicated in the error information registered in the table of the error log 38a (Yes in step S113), the determining circuit 40 determines a transmission path failure of the DIMM to be inspected, and outputs the result of the determination to the CPU 15a (or the management LSI 18) (in step S114). When the error does not exist in the rank that is indicated in the inspection result information registered in the table of the inspection log 38b and is not indicated in the error information registered in the table of the error log 38a (No in step S113), the determining circuit 40 determines a memory failure within the DIMM to be inspected, and outputs the result of the determination to the CPU 15a (or the management LSI 18) (in step S115).

As described above, the information processing system according to the first embodiment and the memory controller each use the hardware to automatically and simultaneously output any of the error reports and start performing the failure inspection. Thus, even during an operation of the information processing system, the information processing system and the memory controller can each quickly and accurately determine a transmission path failure caused by the memory module or a memory failure of the memory module while holding stored data.

In addition, it is not necessary to perform a reproduction test (causing many processes to be performed) in order to specify the location of a failure. Thus, the maintainability of the system can be improved. In addition, it is easy to early perform the recovery process of recovering the system from a failure on the basis of the result of the determination. Thus, it is possible to quickly take measures on the basis of the location of the failure, and the reliability of the information processing system can be improved.

Figure 7:
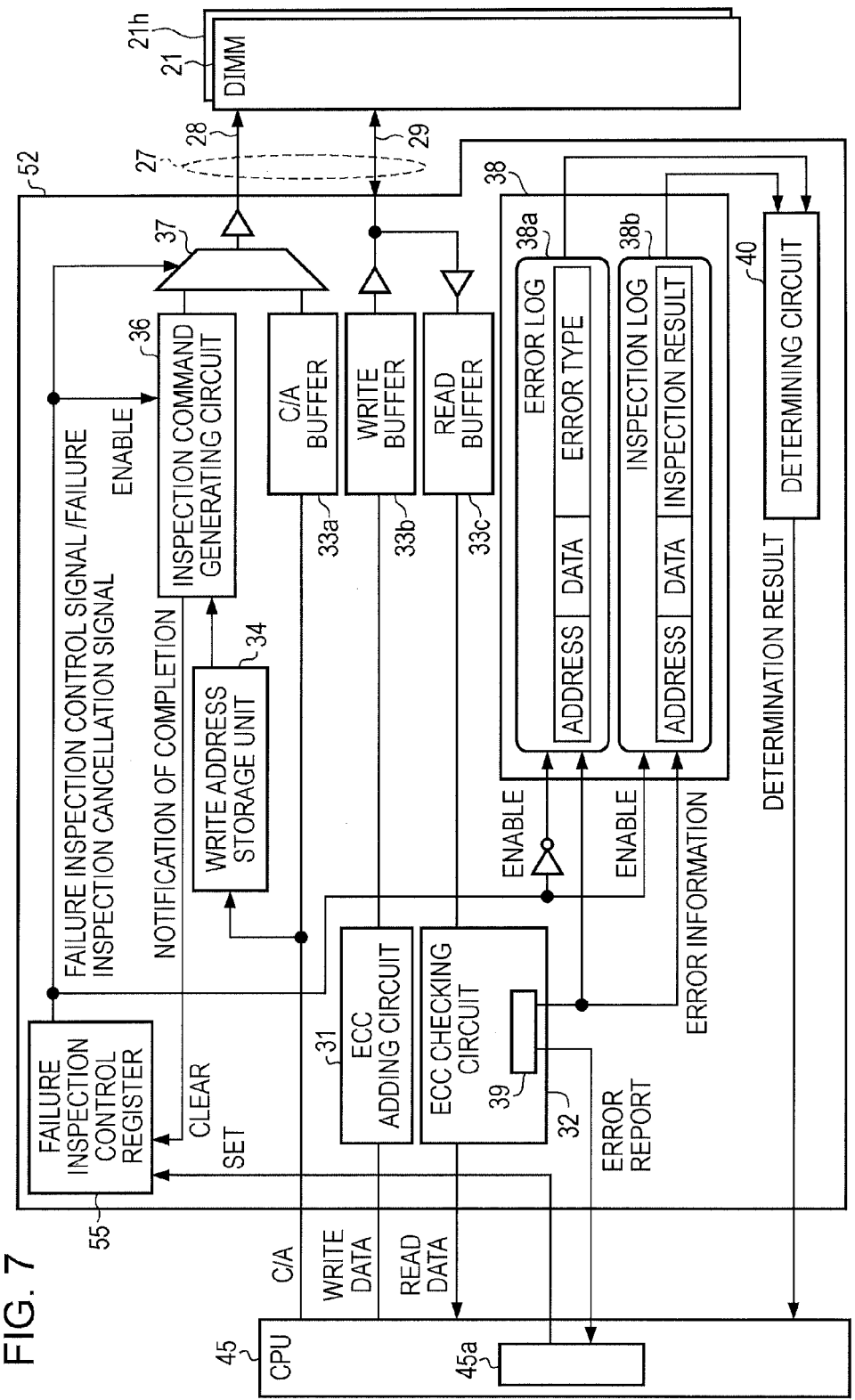
FIG. 7 is a diagram illustrating an internal configuration of a memory controller that is included in an information processing system according to a second embodiment.

FIG. 7 is a diagram illustrating an internal configuration of a memory controller included in an information processing system according to a second embodiment. FIG. 7 illustrates a memory controller 52 that is an example of the memory controller 12a illustrated in FIG. 2a, and an illustration of the management LSI 18 is omitted in FIG. 7.

The memory controller 52 illustrated in FIG. 7 is different from the memory controller 22 illustrated in FIG. 3 in that the memory controller 52 has a failure inspection control register 55. In FIG. 7, a CPU 45 that executes an inspection program 45a is illustrated as an example of the CPU 15a illustrated in FIG. 3. In FIG. 7, constituent parts that are common to FIG. 3 are designated by the same reference numerals, and a description thereof is omitted.

In FIG. 7, the inspection program 45a is executed by the CPU 45 as an example. However, the inspection program 45a may be executed by the management LSI 18. In addition, the inspection program 45a may be included in a part of management software of an operation system as inspection software. In this case, the error reports are provided to the management software through the management LSI 18, and the management software is executed in a similar manner to the inspection program 45a.

The memory controller 52 includes the failure inspection control register 55 and the inspection command generating circuit 36, which are an example of the failure inspection controller. In addition, the memory controller 52 includes the determining circuit 40 that is the example of the determining unit.

When an uncorrectable error occurs or when the number of correctable errors exceeds the predetermined number, the error information output unit 39 outputs the interested error report to the CPU 45. When the CPU 45 receives the error report, the CPU 45 executes the inspection program 45a.

The inspection program 45a references a preregistered requirement and determines whether or not the failure inspection needs to be performed. When the inspection program 45a determines that the failure inspection needs to be performed, the CPU 45 outputs a set signal to the failure inspection control register 55. The failure inspection control register 55 receives the set signal, and writes and sets predetermined data. The preregistered requirement may be set by the user. In addition, the preregistered requirement may be an operational time, the number of times of outputting of any of the error reports, or the like.

The failure inspection control register 55 uses the set signal as a trigger and outputs the failure inspection control signal to each of the circuits included in the memory controller 52 so as to change the mode of each of the circuits from the normal mode to the failure inspection mode.

After that, the processes that are the same as the first embodiment are performed. Thus, the inspection command generating circuit 36 generates an inspection command to read data from a write address for each of ranks to be inspected, and issues the inspection command to each of the ranks.

At the stage of a manufacturing process, all the ranks of the DIMM 21 can be set to the ranks to be inspected. However, during an operation of the system, when a time for the inspection is long, a system error may occur with high probability. Thus, it is preferable that the ranks to be inspected be selected on the basis of the status of use of the DIMM 21 during an operation of the system. In addition, the inspection command generating circuit 36 may generate a command to read data a plurality of times on the basis of the status of an operation of the information processing system and acquire a plurality of inspection results in order to perform the inspection with high accuracy.

When an error exists in a rank other than the rank (in which the error occurs in the normal mode) as a result of reading of data for the failure inspection, the determining circuit 40 determines a transmission path failure that is caused by the transmission path of the DIMM to be inspected. When an error does not exist in any rank other than the rank in which the error occurs in the normal mode, the determining circuit 40 determines a memory failure within the DIMM to be inspected. In the second embodiment, the determining circuit 40 may reference only the inspection log and determine a transmission path failure or a memory failure in the same manner as the first embodiment.

When data is completely read from all the ranks to be inspected, the inspection command generating circuit 36 outputs, to the failure inspection control register 55, a clear signal that is a notification of the completion. Then, the failure inspection control register 55 clears data. The failure inspection control register 55 uses the clear signal as a trigger and outputs the failure inspection cancellation signal to each of the circuits included in the memory controller 52. Thus, the mode of each of the circuits is changed from the failure inspection mode to the normal mode.

Figure 8:
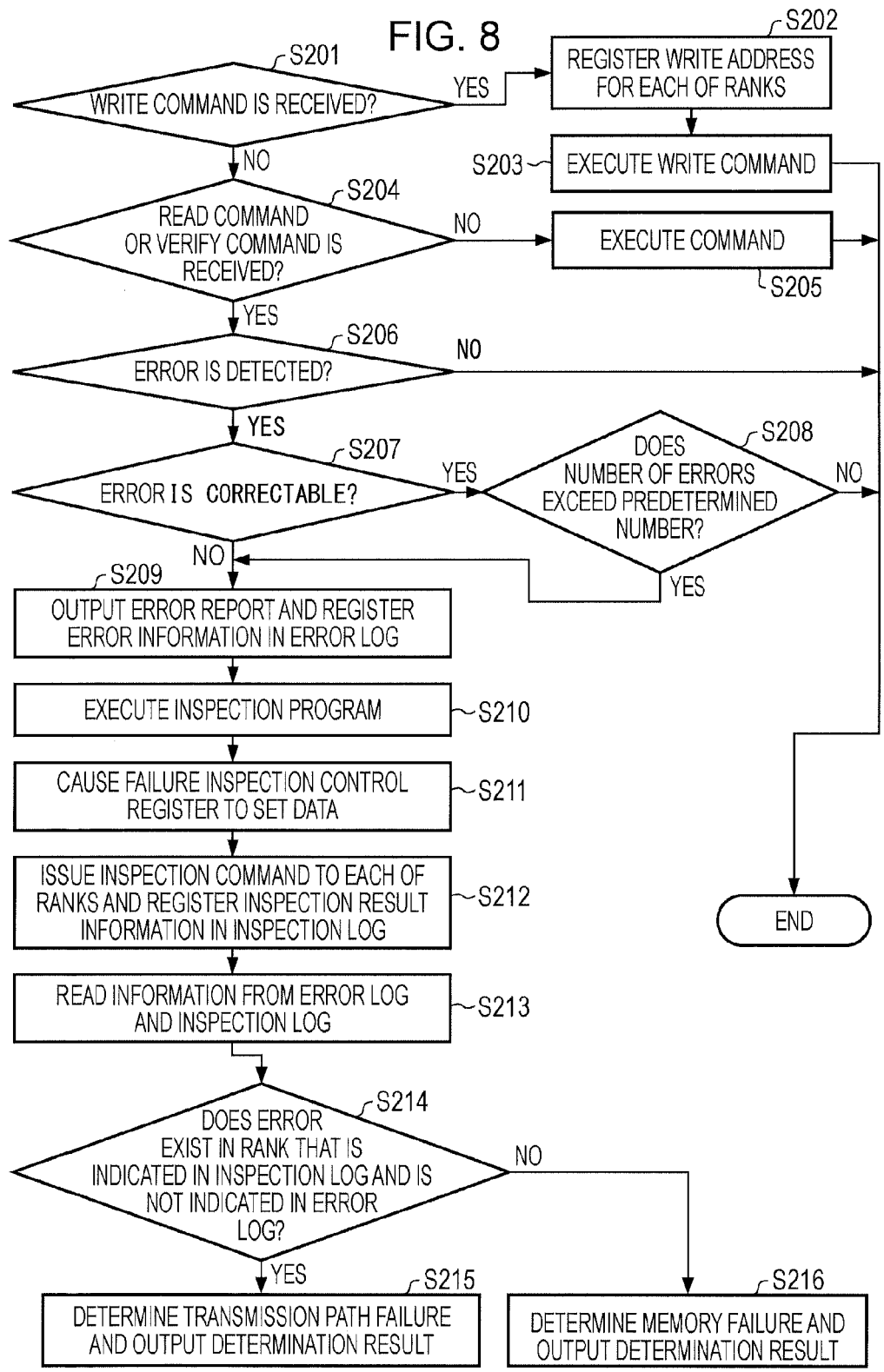
FIG. 8 is a flowchart of a failure determination process to be performed by the information processing system according to the second embodiment.

FIG. 8 is a flowchart of a failure determination process to be performed by the information processing system according to the second embodiment. When the memory controller 52 receives a write command (Yes in step S201), the memory controller 52 registers a write address in the write address storage unit 34 for each of the ranks of the DIMM 21 (in step S202).

The memory controller 52 outputs the write command and an address signal to the DIMM 21 through the command/address bus 28. Then, the memory controller 52 causes the DIMM 21 to execute the write command (in step S203).

When the memory controller 52 receives a read command or a verify command (Yes in step S204), the memory controller 52 outputs the command and an address signal to the DIMM 21 through the command/address bus 28.

Then, the memory controller 52 causes the DIMM 21 to execute the read command or the verify command. When the memory controller 52 receives another command such as an erase command (No in step S204), the memory controller 52 causes the DIMM 21 to execute the other command in the same manner as the aforementioned manner.

When the DIMM 21 executes the read command or the verify command, and a read error is detected by the ECC checking circuit 32 as a result of the execution (Yes in step S206), the error information output unit 39 determines whether or not the read error is correctable (in step S207). When the read error is uncorrectable (No in step S207), the error information output unit 39 outputs the interested error report to the CPU 45 and registers information on the error in the error log 38*a* (in step S209).

When the read error is correctable (Yes in step S207), the error information output unit 39 determines whether or not the number of errors exceeds the predetermined number (in step S208). When the number of the errors exceeds the predetermined number (Yes in step S208), the error information output unit 39 outputs the interested error report to the CPU 45 and registers information on the errors in the error log 38*a* (in step S209).

When the CPU 45 receives any of the error reports, the CPU 45 activates the inspection program 45*a* (in step S210). The inspection program 45*a* references the preregistered requirement and determines whether or not the failure inspection needs to be performed. When the inspection program 45*a* determines that the failure inspection needs to be performed, the CPU 45 outputs the set signal to the failure inspection control register 55.

The failure inspection control register 55 receives the set signal, and writes and sets data (in step S211). Then, the failure inspection control register 55 outputs the failure inspection control signal so as to change the mode of each of the circuits included in the memory controller 52 from the normal mode to the failure inspection mode.

When the inspection command generating circuit 36 receives the failure inspection control signal, the mode of the inspection command generating circuit 36 is changed from the normal mode to the failure inspection mode. The inspection command generating circuit 36 reads a write address from the write address storage unit 34 for each of ranks to be inspected and extracts write addresses to be inspected. The inspection command generating circuit 36 generates a command to read data from the write addresses to be inspected, and issues the generated read command to each of the ranks to be inspected.

The ECC checking circuit 32 detects and corrects an error in the data read for the failure inspection in the same manner as the normal mode. After that, the error information output unit 39 outputs inspection result information that includes an address, the read data, an error type and the like, regardless of whether or not the error exists. The error information output unit 39 registers the inspection result information in the table of the inspection log 38*b* (in step S212).

The determining circuit 40 reads the information registered in the error log 38*a* and the information registered in the inspection log 38*b* (in step S213). The determining circuit 40 determines whether or not an error exists in a rank that is indicated in the inspection result information registered in the table of the inspection log 38*b* and is not indicated in the error information registered in the table of the error log 38*a* (in step S214).

When the error exists in the rank that is indicated in the inspection result information registered in the table of the inspection log 38*b* and is not indicated in the error information registered in the table of the error log 38*a* (Yes in step S214), the determining circuit 40 determines a transmission path failure caused by the DIMM to be inspected, and transmits the result of the determination to the CPU 45 (in step S215). When the error does not exist in the rank that is indicated in the inspection result information registered in the table of the inspection log 38*b* and is not indicated in the error information registered in the table of the error log 38*a* (No in step S214), the determining circuit 40 determines a memory failure within the DIMM to be inspected and transmits the result of the determination to the CPU 45 (in step S216).

As described above, the information processing system according to the second embodiment and the memory controller can each use the inspection program, determines whether to need to perform the failure inspection and the timing of the failure inspection, and perform the failure inspection. In addition, since the inspection program is used, a criterion to determine whether to need to perform the failure inspection can be changed after shipment of a product and during an operation of the system.

Thus, the information processing system according to the second embodiment and the memory controller can each quickly and accurately determine a transmission path failure caused by the memory module or a memory failure of the memory module while holding data stored during an operation of the system.

In addition, it is not necessary to perform a reproduction test (causing many processes) in order to specify the location of a failure. Thus, the maintainability of the system can be improved. In addition, the recovery process of recovering the system from a failure on the basis of the result of the determination can be early performed. Thus, it is possible to quickly take measures on the basis of the location of the failure, and the reliability of the information processing system can be improved.

The first and second embodiments describe the techniques for performing the failure inspection and determining the location of a failure on the basis of the state of an error. It can be considered that the memory controller autonomously recovers from the failure on the basis of the result of the determination.

If data that has an uncorrectable error and is indispensable for the information processing system, the system cannot continuously operate. When an error is correctable or when the data is dispensable and can operate, the system can continuously operate. Thus, in order to prevent a memory error, an error recovery control circuit is provided as described below.

Figure 9:
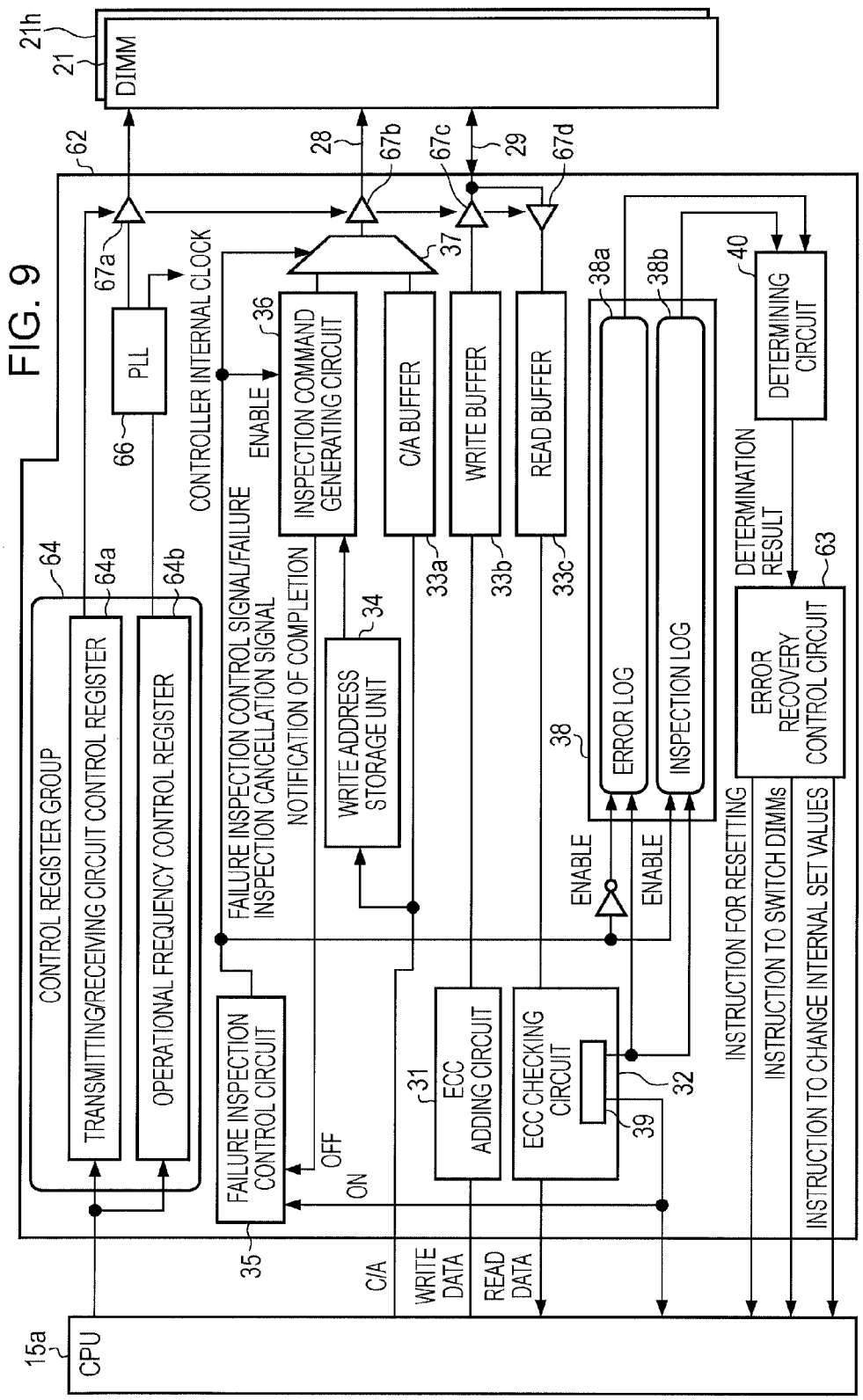
FIG. 9 is a diagram illustrating an internal configuration of a memory controller that is included in an information processing system according to a third embodiment.

FIG. 9 is a diagram illustrating an internal configuration of a memory controller included in an information processing system according to a third embodiment. The memory controller 62 illustrated in FIG. 9 is a modified example and formed by adding an error recovery control circuit 63 to the memory controller 22 illustrated in FIG. 3. The error recovery control circuit 63 is an example of an error recovery controller.

In addition, FIG. 9 illustrates a control register group 64, a PLL circuit 66 and transmitting/receiving circuits 67a to 67d. The control register group 64 includes a transmitting/receiving circuit control register 64a and an operational frequency control register 64b. In FIG. 9, constituent parts that are common to FIG. 3 are designated by the same reference numerals, and a description thereof is omitted.

The error recovery control circuit 63 receives, from the determining circuit 40, the determination result that indicates the transmission path failure or the memory failure. The error recovery control circuit 63 outputs an instruction signal to the CPU 15a to instruct the CPU 15a to control a recovery process to be performed by the memory controller 62.

The system may be configured so that the management LSI 18 performs the process on an error instead of the CPU 15a. In this case, the error information output unit 39 outputs an interested error report to the management LSI 18, and the error recovery control circuit 63 outputs various instructions to the management LSI 18 on the basis of the determination result, although an illustration of the operations is omitted.

The present embodiment describes that the error recovery control circuit 63 is included in the memory controller. The error recovery control circuit 63 may be included in another circuit (such as the CPU or the management LSI) that can perform maintenance control and is included in the information processing system. In addition, the error recovery control circuit 63 may be included in an external device. In this case, the CPU, the management LSI or the like may receive the determination result from the determining circuit 40 and transfer the determination result to the error recovery control circuit 63. In each of the cases, even when a mounting area of the memory controller is small, the error recovery control circuit can be achieved.

Figure 10:
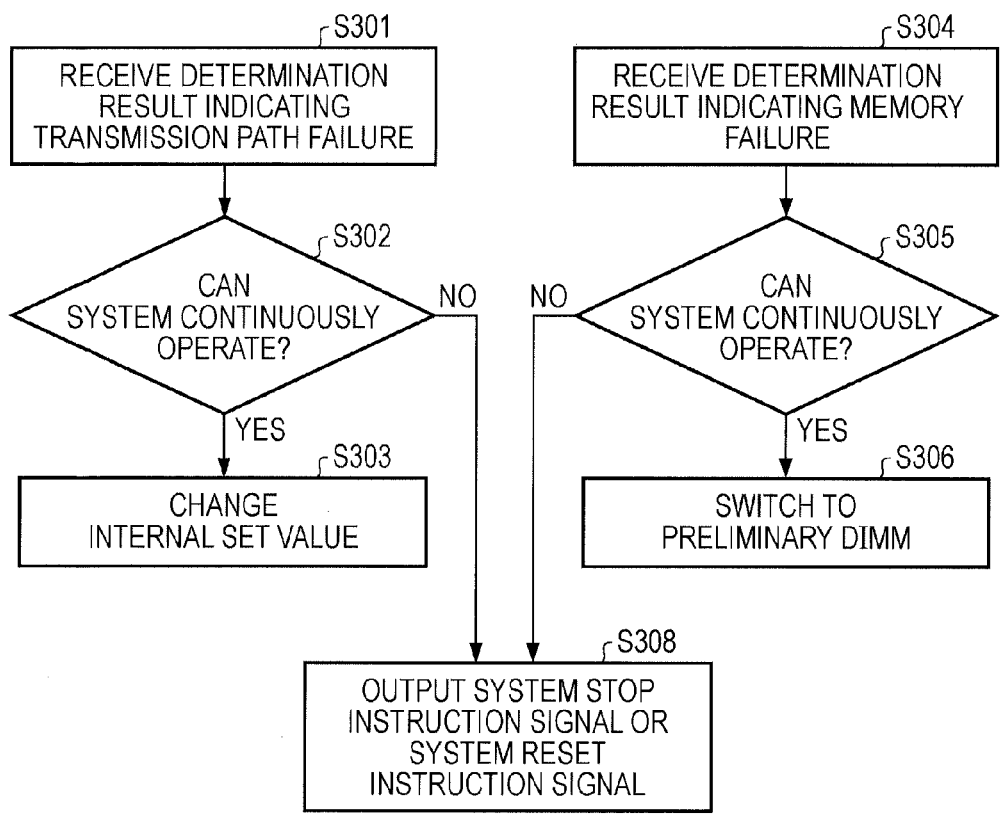
FIG. 10 is a flowchart of a recovery process.

FIG. 10 is a flowchart of the recovery process to be performed by the error recovery control circuit. When the error recovery control circuit 63 receives, from the determining circuit 40, the determination result that indicates the transmission path failure (in step S301), the error recovery control circuit 63 determines the state of the transmission path failure and determines whether or not the information processing system can continuously operate (in step S302). When the error recovery control circuit 63 determines that the information processing system cannot continuously operate (No in step S302), the error recovery control circuit 63 outputs a system stop instruction signal or a system reset instruction signal to the CPU 15a (or the management LSI 18) (in step S308).

When the error recovery control circuit 63 determines that the information processing system can continuously operate (Yes in step S302), the error recovery control circuit 63 outputs an internal set value change instruction signal to the CPU 15a (or the management LSI 18) in order to change internal set values of the memory controller 62.

When the CPU 15a (or the management LSI 18) receives the internal set value change instruction signal, the CPU 15a (or the management LSI 18) outputs a register setting signal to the control register group 64 to instruct the control register group 64 to change the internal set values. When the register setting signal is input to the transmitting/receiving circuit control register 64a, the transmitting/receiving circuit control register 64a changes set voltage levels of the transmitting/receiving circuits 67a to 67d. The transmitting/receiving circuits 67a to 67d are an example of a transmitter/receiver that transmits and receives data to and from the memory interface 27.

In addition, when the register setting value is input to the operational frequency control register 64b of the control register group 64, the operational frequency control register 64b changes settings of the PLL circuit 66 and reduces an internal clock frequency of the memory controller 62. In addition, the operational frequency control register 64b reduces a clock frequency for transmission to the DIMM 21. In this manner, a transmission rate of the transmission path is reduced, and the internal set values are changed (in step S303).

A variation in a temperature in an operational environment or a variation in a voltage of the system can be considered as a cause of the transmission path failure that occurs during an operation of the system. Thus, the system can recover from the transmission path failure (caused by the transmission path of the memory controller, the transmission path of the memory interface or the like) by reducing a transmission load of the memory controller or a transmission load of the memory interface 27, as described above.

However, when the transmission load is reduced and an error cannot be expected to be corrected, the error recovery control circuit 63 outputs a reset instruction signal to the CPU 15a (or the management LSI 18) to cause the CPU 15a (or the management LSI 18) to stop or reset the system.

When the error recovery control circuit 63 receives, from the determining circuit 40, the determination result that indicates the memory failure (in step S304), the error recovery control circuit 63 determines the state of the memory failure and determines whether or not the information processing system can continuously operate (in step S305).

When the error recovery control circuit 63 determines that the information processing system can continuously operate (Yes in step S305), the error recovery control circuit 63 outputs a DIMM switching instruction signal to the CPU 15a (or the management LSI 18). Then, the CPU 15a (or the management LSI 18) disconnects the DIMM in which an error occurs, and the CPU 15a (or the management LSI 18) switches from the DIMM to a preliminary DIMM 21h (in step S306). When a preliminary DIMM to which the DIMM in which the error occurs can be switched does not exist, the CPU 15a (or the management LSI 18) only disconnects the DIMM in which the error occurs.

When the error recovery control circuit 63 determines that the information processing system cannot continuously operate (No in step S305), the error recovery control circuit 63 outputs the system stop instruction signal or the system reset instruction signal to the CPU 15a (or the management LSI 18) (in step S308).

As described above, the information processing system according to the third embodiment and the memory controller can each continue an operation of the memory module as much as possible. Thus, even when a certain error occurs, the system does not stop immediately and can continuously operate.

Figure 11:
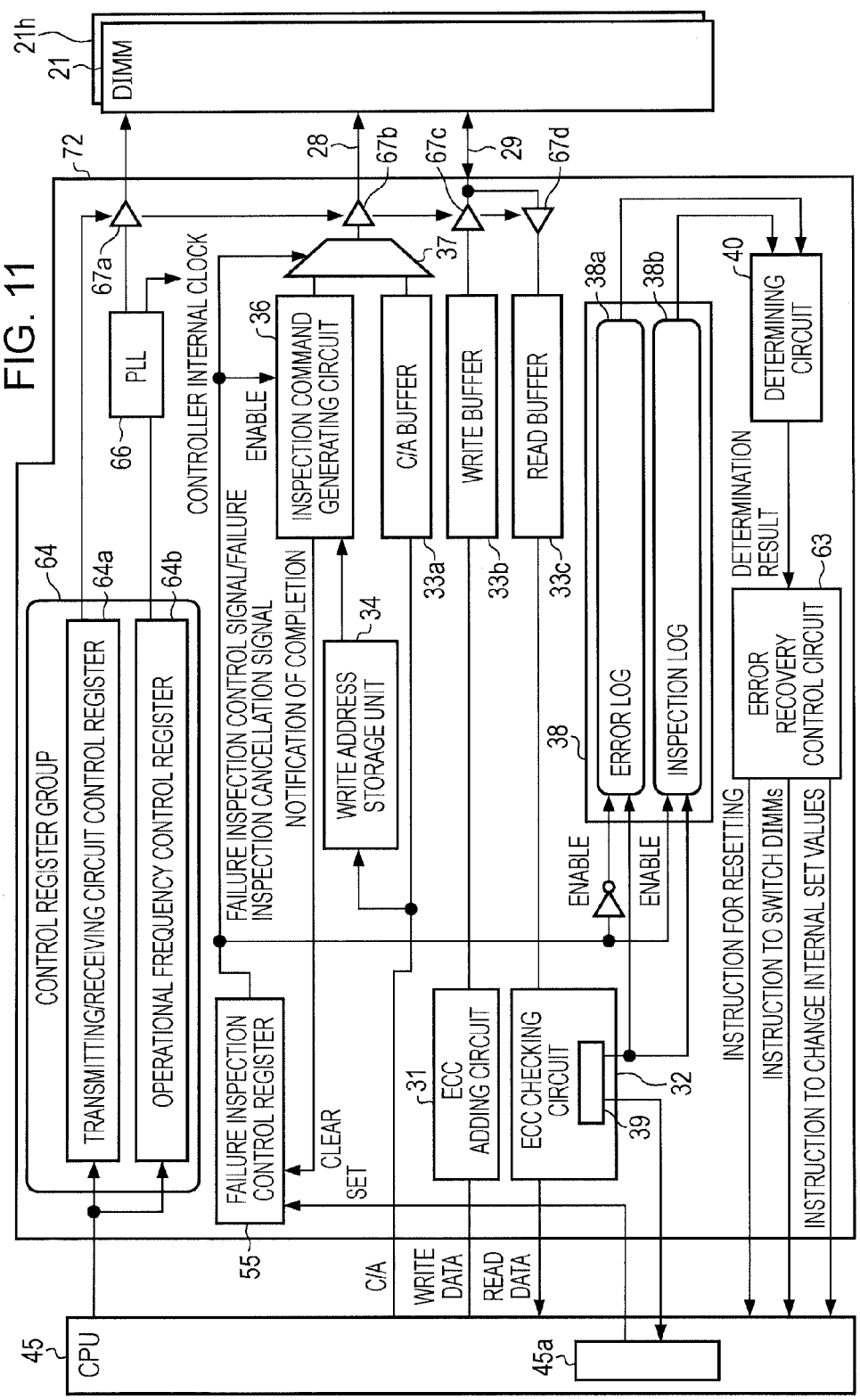
FIG. 11 is a diagram illustrating an internal configuration of a memory controller that is included in an information processing system according to a fourth embodiment.

FIG. 11 is a diagram illustrating an internal configuration of a memory controller included in an information processing system according to a fourth embodiment. The memory controller 72 illustrated in FIG. 11 is a modified example and formed by adding the error recovery control circuit 63 to the memory controller 52 illustrated in FIG. 7.

In addition, FIG. 11 illustrates the control register group 64, the PLL circuit 66 and the transmitting/receiving circuit 67a to 67d. The control register group 64 includes the transmitting/receiving circuit control register 64a and the operational frequency control register 64b. In FIG. 9, constituent parts that are common to FIGS. 7 and 9 are designated by the same reference numerals, and a description thereof is omitted.

The error recovery control circuit 63 receives, from the determining circuit 40, the determination result that indicates the transmission path failure or the memory failure. The error recovery control circuit 63 outputs an instruction signal to the CPU 45 to instruct the CPU 45 to control the recovery process to be performed by the memory controller 72.

The system may be configured so that the management LSI 18 performs the process on an error instead of the CPU 45. In this case, the error recovery control circuit 63 outputs various instructions to the management LSI 18 on the basis of the determination result, although an illustration of this operation is omitted.

The present embodiment describes that the error recovery control circuit 63 is included in the memory controller. The error recovery control circuit 63 may be included in another circuit (such as the CPU or the management LSI) that can perform maintenance control and is included in the information processing system. In addition, the error recovery control circuit 63 may be included in an external device. In this case, the CPU, the management LSI or the like may receive the determination result from the determining circuit 40 and transfer the determination result to the error recovery control circuit 63. In each of the cases, even when a mounting area of the memory controller is small, the error recovery control circuit can be achieved.

The recovery process that is performed by the error recovery control circuit 63 illustrated in FIG. 11 is described with reference to FIG. 10. When the error recovery control circuit 63 receives, from the determining circuit 40, the determination result that indicates the transmission path failure (in step S301), the error recovery control circuit 63 determines the state of the transmission path failure and determines whether or not the information processing system can continuously operate (in step S302).

When the error recovery control circuit 63 determines that the information processing system cannot continuously operate (No in step S302), the error recovery control circuit 63 outputs the system stop instruction signal or the system reset instruction signal to the CPU 45 (or the management LSI 18) (in step S308).

When the error recovery control circuit 63 determines that the information processing system can continuously operate (Yes in step S302), the error recovery control circuit 63 outputs the internal set value change instruction signal to the CPU 45 (or the management LSI 18) in order to change internal set values of the memory controller 72.

When the CPU 45 (or the management LSI 18) receives the internal set value change instruction signal, the CPU 45 (or the management LSI 18) outputs the register setting signal to the control register group 64 to instruct the control register group 64 to change the internal set values. When the register setting signal is input to the transmitting/receiving circuit control register 64a, the transmitting/receiving circuit control register 64a changes set voltage levels of the transmitting/receiving circuits 67a to 67d. The transmitting/receiving circuits 67a to 67d are the example of the transmitter/receiver that transmits and receives data to and from the memory interface 27.

When the register setting signal is input to the operational frequency control register 64b of the control register group 64, the operational frequency control register 64b changes the settings of the PLL circuit 66 and reduces an internal clock frequency of the memory controller 72. In addition, the operational frequency control register 64b reduces a clock frequency for transmission to the DIMM 21. In this manner, the transmission rate of the transmission path is reduced, and the internal set values are changed (in step S303).

A variation in a temperature in an operational environment or a variation in a voltage of the system can be considered as a cause of the transmission path failure that occurs during an operation of the system. Thus, the system can recover from the transmission path failure (caused by the transmission path of the memory controller, the transmission path of the memory interface or the like) by reducing a transmission load of the memory controller or the transmission load of the memory interface 27, as described above.

However, when the transmission load is reduced and an error cannot be expected to be corrected, the error recovery control circuit 63 outputs the reset instruction signal to the CPU 45 (or the management LSI 18) to cause the CPU 45 (or the management LSI 18) to stop or reset the system.

When the error recovery control circuit 63 receives, from the determining circuit 40, the determination result that indicates the memory failure (in step S304), the error recovery control circuit 63 determines the state of the memory failure and determines whether or not the information processing system can continuously operate (in step S305).

When the error recovery control circuit 63 determines that the information processing system can continuously operate (Yes in step S305), the error recovery control circuit 63 outputs the DIMM switching instruction signal to the CPU 45 (or the management LSI 18). Then, the CPU 45 (or the management LSI 18) disconnects the DIMM in which an error occurs, and the CPU 45 (or the management LSI 18) switches from the DIMM to the preliminary DIMM 21h (in step S306). When a preliminary DIMM to which the DIMM in which the error occurs can be switched does not exist, the CPU 45 (or the management LSI 18) only disconnects the DIMM in which the error occurs.

When the error recovery control circuit 63 determines that the information processing system cannot continuously operate (No in step S305), the error recovery control circuit 63 outputs the system stop instruction signal or the system reset instruction signal to the CPU 45 (or the management LSI 18) (in step S308).

As described above, the information processing system according to the fourth embodiment and the memory controller can each continue an operation of the memory module as much as possible. Thus, even when a certain error occurs, the system does not stop immediately and can continuously operate.

A memory controller disclosed herein and an information processing system disclosed herein can each quickly and accurately determine the memory failure of the memory module or the transmission path failure. Thus, it is easy to perform the recovery process of recovering the system from the failure on the basis of the result of the determination. Thus, it is possible to quickly take measures on the basis of the location of the failure, and the reliability of the information processing system can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory controller that is connected with a memory module having a plurality of unit memory regions and controls access to the memory module, the memory controller comprising:
   an error detector configured to perform an error detection on data read from the memory module;
   a failure inspection controller configured to switch a mode of the memory controller from a normal mode to a failure inspection mode, read data from an address, where data was written, to be inspected for each of the plurality of unit memory regions, cause the error detector to detect an error in the read data and perform a failure inspection; and
   a determining unit configured to determine existence of a memory failure and a transmission path failure based on a state of the error detected by comparing error information of a memory region including inspection information of the plurality of memory regions with failure inspection data,
   wherein the state of the error, determined by the determining unit, indicates one of the memory failure and the transmission path failure, the memory failure being caused by a failure that occurs in the memory module, and the transmission path failure being caused by a failure of a data transmission path located outside of the memory module.

2. A memory controller according to claim 1, wherein the failure inspection controller switches from the normal mode to the failure inspection mode when an uncorrectable error is detected by the error detector during the normal mode, or when a number of correctable errors that are detected by the error detector during the normal mode exceeds a predetermined number.

3. A memory controller according to claim 2, further comprising:
   a first storage unit configured to store error information on the uncorrectable error or on the correctable errors of which the number of correctable errors exceeds the predetermined number; and
   a second storage unit configured to store inspection result information on the results of the inspection controlled by the failure inspection controller,
   wherein the determining unit determines the memory failure or the transmission path failure based on the error information or the state of the error detected from the unit memory regions indicated in the inspection result information.

4. A memory controller according to claim 3, wherein the determining unit compares the state of the detected error indicated in the error information with the states of the errors detected from the unit memory regions, determines the memory failure when an error exists only in a same unit memory region, and determines the transmission path failure when an error exists in a different unit memory region.

5. A memory controller according to claim 1, wherein the determining unit references the state of the error detected from the unit memory regions, determines the memory failure when an error exists in a part of unit memory regions to be inspected, and determines the transmission path failure when an error exists in a plurality of unit memory regions among the unit memory regions to be inspected.

6. A memory controller according to claim 1, comprising:
   an error recovery controller configured to control error recovery based on a result of the determination made by the determining unit.

7. A memory controller according to claim 6, wherein the error recovery controller disconnects a connection to the memory module in which an error is detected when the memory failure is determined.

8. A memory controller according to claim 7, wherein the error recovery controller switches from the memory module to a preliminary memory module when the memory failure is determined.

9. A memory controller according to claim 6, wherein the error recovery controller performs control to change at least one of a set operational frequency and a set value of a transceiver and a receiver included in the memory controller when the transmission path failure is determined.

10. An information processing system comprising:
    a memory module having a plurality of unit memory regions;
    a memory controller, connected with the memory module via a memory interface, configured to control access to the memory module;
    an error detector, which is in the memory controller, configured to perform an error detection on data read from the memory module;
    a failure inspection controller configured to switch a mode of the memory controller from a normal mode to a failure inspection mode, read data from an address, where data was written, to be inspected for each of the plurality of unit memory regions, cause the error detector to detect an error in the read data and perform a failure inspection; and
    a determining unit configured to determine existence of a memory failure and a transmission path failure based on a state of the error detected by comparing error information of a memory region including inspection information of the plurality of memory regions with failure inspection data,
    wherein the state of the error, determined by the determining unit, indicates one of the memory failure and the transmission path failure, the memory failure being caused by a failure that occurs in the memory module, and the transmission path failure being caused by a failure of a data transmission path located outside of the memory module.

11. An information processing system according to claim 10, wherein the failure inspection controller switches from the normal mode to the failure inspection mode when an uncorrectable error is detected by the error detector during the normal mode, or when a number of correctable errors that are detected by the error detector during the normal mode exceeds a predetermined number.

12. An information processing system according to claim 11, comprising:

a first storage unit configured to store error information on the uncorrectable error or on the correctable errors of which the number of correctable errors exceeds the predetermined number; and a second storage unit configured to store inspection result information on the results of the inspection controlled by the failure inspection controller, wherein the determining unit determines the memory failure or the transmission path failure based on the error information or the state of the error detected from the unit memory regions indicated in the inspection result information.

13. An information processing system according to claim 12, wherein the determining unit compares the state of the detected error indicated in the error information with the states of the errors detected from the unit memory regions, determines the memory failure when an error exists only in a same unit memory region, and determines the transmission path failure when an error exists in a different unit memory region.

14. An information processing system according to claim 10, wherein the determining unit references the state of the error detected from the unit memory regions, determines the memory failure when an error exists in a part of unit memory regions to be inspected, and determines the transmission path failure when an error exists in a plurality of unit memory regions among the unit memory regions to be inspected.

15. An information processing system according to claim 10, comprising an error recovery controller configured to control error recovery based on a result of the determination made by the determining unit.

16. An information processing system according to claim 15, wherein the error recovery controller disconnects a connection to the memory module in which an error is detected when the memory failure is determined.

17. An information processing system according to claim 16, wherein the error recovery controller further switches from the memory module to a preliminary memory module when the memory failure is determined.

18. An information processing system according to claim 15, wherein the error recovery controller performs control to change at least one of a set operational frequency and a set value of a transceiver and a receiver included in the memory controller when the transmission path failure is determined.

* * * * *